United States Patent
Choi et al.

(10) Patent No.: US 9,407,061 B2
(45) Date of Patent: Aug. 2, 2016

(54) TUNABLE LIGHT SOURCE (71) Applicant: ELECTRONICS AND TELECOMMUNICATIONS RESEARCH INSTITUTE, Daejeon (KR)

(72) Inventors: Byung Seok Choi, Daejeon (KR); Ki Hong Yoon, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/802,431

(22) Filed: Jul. 17, 2015

(65) Prior Publication Data

US 2016/0020575 A1    Jan. 21, 2016

(30) Foreign Application Priority Data

Jul. 18, 2014  (KR) .................. 10-2014-0091084

(51) Int. Cl.
| | |
|---|---|
| *H01S 5/024* | (2006.01) |
| *H01S 5/14* | (2006.01) |
| *H04B 10/00* | (2013.01) |
| *H01S 5/022* | (2006.01) |
| *H01S 5/068* | (2006.01) |

(52) U.S. Cl.
CPC .............. *H01S 5/02438* (2013.01); *H01S 5/141* (2013.01); *H04B 10/00* (2013.01); *H01S 5/02248* (2013.01); *H01S 5/02415* (2013.01); *H01S 5/06804* (2013.01)

(58) Field of Classification Search
CPC .... H01S 3/1003; H01S 3/0405; H01S 3/1028
See application file for complete search history.

(56) References Cited

U.S. PATENT DOCUMENTS

| | | | |
|---|---|---|---|
| 6,303,040 | B1 | 10/2001 | Oh et al. |
| 8,548,015 | B2 | 10/2013 | Choi |

(Continued)

FOREIGN PATENT DOCUMENTS

| | | |
|---|---|---|
| KR | 10-2000-0018925 A | 4/2000 |
| KR | 10-2009-0011837 A | 2/2009 |
| KR | 10-2011-0101016 A | 9/2011 |

(Continued)

OTHER PUBLICATIONS

Min-Cheol Oh, "Tunable wavelength filters with Bragg gratings in polymer waveguides", Applied Physics Letters, vol. 73, No. 18, pp. 2543-2545, Nov. 2, 1998.

(Continued)

*Primary Examiner* — Dung Nguyen
(74) *Attorney, Agent, or Firm* — Rabin & Berdo, P.C.

(57) ABSTRACT

Provided herein is an external-cavity type wavelength tunable laser including gain medium configured to generate an optical signal and amplify the generated optical signal based on a bias current applied; an external reflector configured to be coupled optically with the gain medium; a second thermistor provided on the side of the gain medium and configured to measure a temperature of the gain medium; a first thermistor provided on the external reflector and configured to measure a temperature of the external reflector; and a thermoelectric cooler configured to transfer generated heat based on the temperatures measured by the first and second thermistors.

7 Claims, 8 Drawing Sheets

(56) References Cited

U.S. PATENT DOCUMENTS

2010/0208756 A1* 8/2010 Noh .................... G02B 6/4206
372/20
2012/0014398 A1 1/2012 Choi

FOREIGN PATENT DOCUMENTS

KR 10-2012-0008326 A 1/2012
KR 10-2012-0047403 A 5/2012

OTHER PUBLICATIONS

Jie Hyun Lee et al., "Tunable External Cavity Laser Based on Polymer Waveguide Platform for WDM Access Network", IEEE Photonics Technology Letters, vol. 17, No. 9, pp. 1956-1958, Sep. 2005.
Byung-Seok Choi et al., "10-Gb/s direct modulation of polymer-based tunable external cavity lasers", Optics Express, vol. 20, No. 18, pp. 20368-20374, Aug. 27, 2012.

* cited by examiner

TUNABLE LIGHT SOURCE

CROSS-REFERENCE TO RELATED APPLICATION

The present application claims priority to Korean patent application number 10-2014-0091084, filed on Jul. 18, 2014, the entire disclosure of which is incorporated herein in its entirety by reference.

BACKGROUND

1. Field of Invention

Various embodiments of the present invention relate to optical communication, and more particularly, to a tunable laser for use in optical communication.

2. Description of Related Art

The term 'LASER' is an acronym for 'Light Amplification by Stimulated Emission of Radiation', and the main element necessary for the formation of a laser is a resonator that includes a gain medium and a pump that supplies energy to the laser. For a radiated light to be amplified by a stimulated emission process, there must be a suitable gain medium the type of which determines the oscillation wavelength band of the laser. The most representative examples of lasers that are relatively easily tunable are gas lasers, dye lasers, and solid-state lasers, according to the types of the gain medium.

However, in the case of such a general resonator based laser, the wavelength band is limited to an emission bandwidth that the gain medium has, and thus a nonlinear frequency conversion method is frequently used as a way to overcome this. By transmitting light through a suitable nonlinear single crystal in accordance with a phase matching condition and then using an SFG (sun frequency generation) method, DFG (difference frequency generation) method, and an OPG & OPA (optical parametric generation & amplification) method, it is possible to expand a tuning range from an ultraviolet ray to infrared area without preparing an additional resonator. Besides the aforementioned, it is also possible to configure an additional resonator including a nonlinear single crystal such as an OPO (optical parametric oscillator) and resonating a light generated by an optical medium effect within the resonator, thereby expanding the wavelength adjustment range.

Research is actively underway on passive optical networks (PON) that are based on wavelength division multiplexing (WDM) (hereinafter referred to as 'WDM-PON'). These networks have their basis on adjusting wavelengths. WDM-PON may provide converged services of voice, data, and broadcast.

In WDM-PON, each subscriber communicates with a center office (CO) using a different wavelength assigned to the subscriber. And since each subscriber uses an exclusive wavelength assigned to each subscriber, WDM-PON has excellent security and enables providing massive communication services, and thus it has an advantage that each subscriber or service may be provided with a transmission technology of a different link rate and frame format.

However, since WDM-PON is a technology of multiplexing various wavelengths in a single optical fiber using the WDM technology, it requires different light sources as many as the number of subscribers that belong to one remote node (RN). Production, installation, and management of light source per wavelength are becoming a great burden to users and subscribers, and thus a big obstacle to commercialization of WDM-PON. In order to resolve such a problem, application methods of tunable lasers capable of selectively tuning the wavelength of a light source is actively being studied.

SUMMARY

A first purpose of various embodiments of the present invention is to provide a tunable external-cavity laser with the stable output from the change of an ambient temperature.

According to an embodiment of the present invention, there is provided an external-cavity type wavelength tunable laser including gain medium configured to generate an optical signal and amplify the generated optical signal based on a bias current applied; an external reflector configured to optical-couple with the gain medium; a second thermistor provided on the gain medium and configured to measure a temperature of the gain medium; a first thermistor provided on the external reflector and configured to measure a temperature of the external reflector; and a thermoelectric cooler configured to perform heat-transferring operations based on the temperatures measured by the first and second thermistors.

The gain medium and the external reflector may be butt-coupled.

The external reflector may be a polymer-based Bragg grating reflector.

The external reflector may include a heater electrode for wavelength adjustment and a phase control electrode for phase control, and the external reflector may control an output wavelength based on a relationship between the temperature measured by the first thermistor and an electrical power input to the heater electrode.

The external reflector may include a heater electrode for wavelength adjustment and a phase control electrode for phase control, and the external reflector may compensate a phase change through the phase control electrode based on the temperatures measured by the first and second thermistors.

The gain medium and the second thermistor may be mounted on a silicon block, and the external reflector and the first thermistor are formed and mounted on a silicon substrate.

The silicon block and the silicon substrate may be optically aligned by an active or passive alignment method.

The silicon block and the silicon substrate may be fixed to each other by a UV curable adhesive.

Various aforementioned embodiments of the present invention enable controlling the temperature of the tunable external-cavity laser based on the temperature of the external reflector so as not to be affected significantly by changes in the ambient temperature. Furthermore, a change in a wavelength according to a changes in the phase that occurs according to changes in ambient temperature and heater operation is monitored using the thermistor provided on the gain medium, based on which the wavelength is controlled. Therefore, it is possible to control the output of the tunable external-cavity laser with stability.

BRIEF DESCRIPTION OF THE DRAWINGS

The above and other features and advantages of the present invention will become more apparent to those of ordinary skill in the art by describing in detail embodiments with reference to the attached drawings in which.

DETAILED DESCRIPTION

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present invention. Furthermore, 'and/or' may include any one of or a combination of the components mentioned.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

Figure 1:
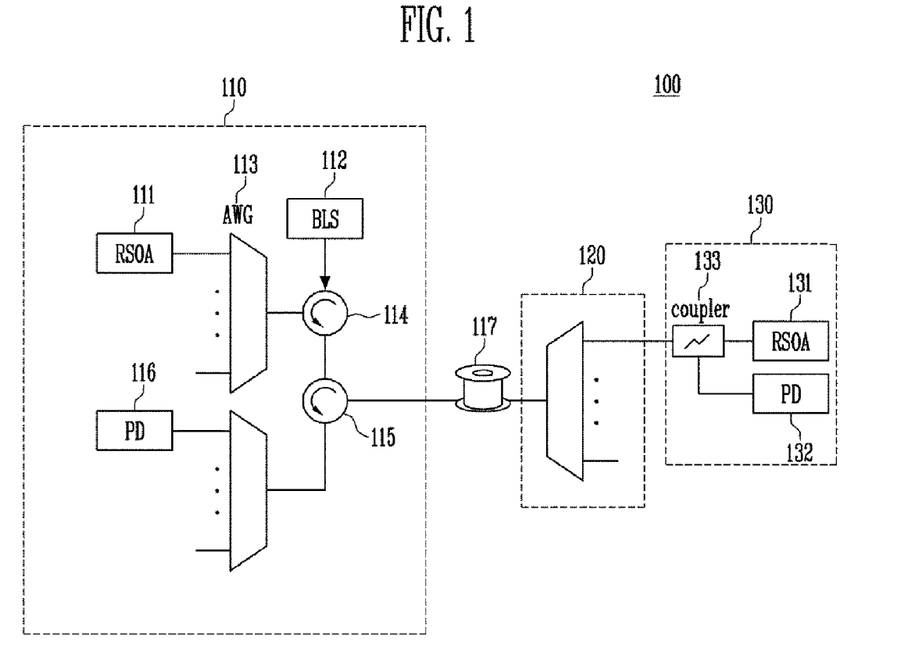
FIG. 1 is a view illustrating a configuration of a conventional WDM-PON using a broadband light source.

FIG. 1 is a conceptual view illustrating a WDM (wavelength division multiplexing)-PON (passive optical network).

Referring to FIG. 1, a WDM-PON may include an OLT (Optical Line Terminal) 110 that is a placed in a CO (Center Office), an ONU or ONT (Optical Network Unit or Optical Network Terminal) 130 that is a subscriber terminal apparatus placed in a subscriber side, and an RN (remote node) 120. The OLT 110 and RN 120 may be connected by a feeder optical fiber 117 of a single core, and the RN 120 and ONU/ONT 130 may be connected by a distribution optical fiber 125.

A downward light to be transmitted from the OLT 110 to the ONU/ONT 130 may be transmitted from a BLS (Broadband Light Source) 112 in the OLT 110 to an RSOA (Reflective Semiconductor Optical Amplifier) 111 for the OLT via a first optical circulator 114 and an AWG (Arrayed Waveguide Grating) 113 that performs WDM multiplexing/demultiplexing functions.

The downward light transmitted to the RSOA 111 may be transmitted from the RSOA 111 for the OLT to the AWG 123 of the RN 120 via the AWG 113, first circulator 114, and second circulator 115, and through the feeder optical fiber 117, and then transmitted to a 1×2 optical coupler (or circulator) 133 in the ONU/ONT 130 through the distribution optical fiber again, and then finally to an RSOA 131 for the ONU and an optical receiver 132.

An upward light to be transmitted from the ONU/ONT 130 to the OLT 110 may be transmitted in a direction opposite to the aforementioned downward light. That is, the upward light may be transmitted from the RSOA 131 for the ONU to an optical receiver 116 for the OLT via the 1×2 RSOA optical coupler 133, distribution optical fiber 125, AWG 123 of the RN 120, feeder optical fiber 117, second circulator 115 and AWG 118.

In the WDM-PON using a broadband light source as illustrated in FIG. 1, the ONU 130 also uses a light source of the OLT 110 side, and thus there is no need to obtain an additional light source in the subscriber terminal. Therefore, it is possible to embody a colorless system. However, since the WDM-PON 100 using a broadband light source injects a seed light source using an additional broadband light source, and the injected seed light source is amplified and modulated in the RSOA 111, there occurs a limitation to the speed, and thus it is regarded that such a WDM-PON 100 is not easy to be used in a 10 Gbps grade system. To compensate this, an element where a reflective electro-absorption modulator is integrated is being proposed as an alternative.

Figure 2:
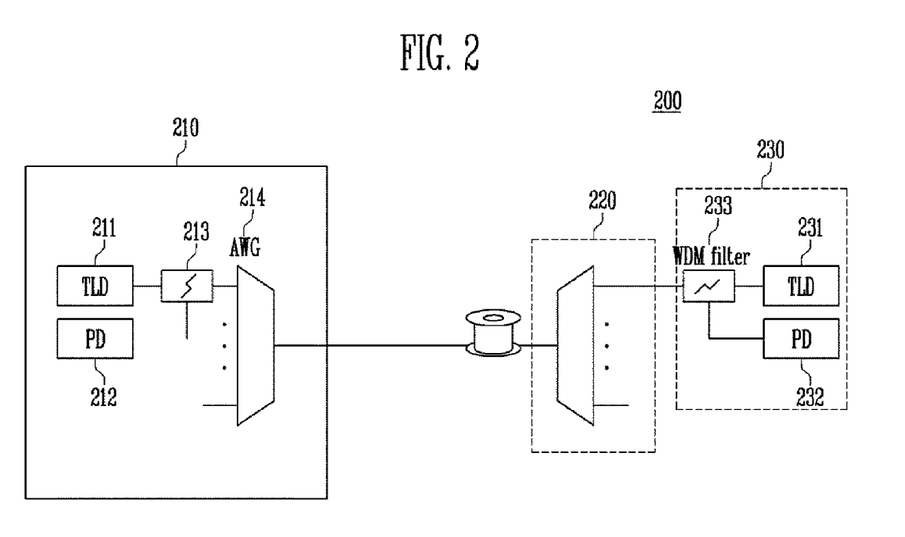
FIG. 2 is a view illustrating a configuration of a conventional WDM-PON using a tunable laser.

FIG. 2 is a view illustrating a configuration of a conventional WDM-PON using a tunable laser.

Referring to FIG. 2, a WDM-PON 200 includes an OLT 210 placed in a CO (Center Office) side, and an ONU/ONT 230 and RN 220 placed in a subscriber side. The OLT 210 and the RN 220 may be connected to each other by an optical fiber 217 of a single core, and the RN 220 and the ONU/ONT 230 may be connected to each other by a distribution optical fiber.

A downward light may be delivered from a TDL (Tunable Laser Diode) 211 to a PD (Photodiode) 232 of the ONU/ONT 230 through a WDM filter 213 and via an AWG 213, feeder optical fiber 217, AWG 223, distribution optical fiber 225, and WDM filter 233. An upward light may proceed in a direction opposite to the downward light, and be transmitted to a PD (Photodiode) 212 of the OLT 210.

Unlike the WDM-PON of FIG. 1, the WDM-PON of FIG. 2 may use tunable lasers 211 and 231 for the OLT 210 and ONU/ONT 230, respectively in order to configure a system that is not dependent on a wavelength. Although the WDM-PON of FIG. 1 that uses a tunable laser has a limitation that the OLT 210 and ONU/ONT 230 must each have a light source, since it is a structure using a laser, it also has an advantage of good performance in terms of speed compared to the WDM-PON of FIG. 1. An important key to embodying such a system lies in whether or not it is possible to make a reliable and high performance tunable laser at low cost.

In an embodiment of the present invention, there is provided a method for implementing a reliable and high performance tunable laser in WDM-PON.

Since a tunable external-cavity laser has an effect where an oscillated light is filtered by the external reflector, single mode lasing becomes much more favorable. However, even if the external-cavity laser is operating stably under certain conditions, when there is a change in the current applied or in the ambient temperature, the operating mode may move to a region where operating mode becomes unstable. In such a case, a phenomenon known as the mode-hopping may occur in the tunable external-cavity laser, and sometimes, a multi-mode lasing may occur. In the case where the mode-hopping or multimode lasing occurs, the error rate of transmitted data may increase in optical communication systems using a certain wavelength in a single mode.

Therefore, in using the tunable external-cavity laser, determining a stable wavelength region under given conditions or determining a stable condition in a given wavelength region is an essential part in using an element.

Hereinafter, explanation on an embodiment of the present invention will be made with the focus on a tunable external-cavity laser using a TO (thermo-optic) effect for convenience. However, a method for adjusting a wavelength according to an embodiment may be applied in a same manner to a general external-cavity light source and be applied in a suitable manner to individual element methods.

A tunable laser is a core element used in various fields such as spectroscopy and sensor and so forth, and various technologies have been proposed to embody a tunable laser. Major examples of a tunable laser include a single integrated laser that uses a Vernier effect using a semiconductor including an SG-DBR (Sampled Grating Distributed Bragg Reflector), an external-cavity laser using an external grating reflector, and a laser array that embodies multi wavelengths by making various single wavelength light sources in an array format.

The tunable mechanisms used in a tunable external-cavity laser may be classified into a technology that separates wavelengths by diffraction angles using the MEMS (Micro Electro Mechanical System) technology, a technology using the TO (Thermo-Optic) effect, and a technology where a wavelength is tuned by a voltage or current such as liquid crystal and so forth.

Reviewing the level of technologies so far, the tunable laser fabricated by a monolithic integration technology is the ideal device, but this has an issue of high cost due to the low yield.

A laser array also has limitation in application due to its size and yield. In the case of the external-cavity laser, the laser may operate with stability, but there exist limitations due to the large size and limitations of high speed operations inevitable in an external-cavity laser.

Figure 3A:
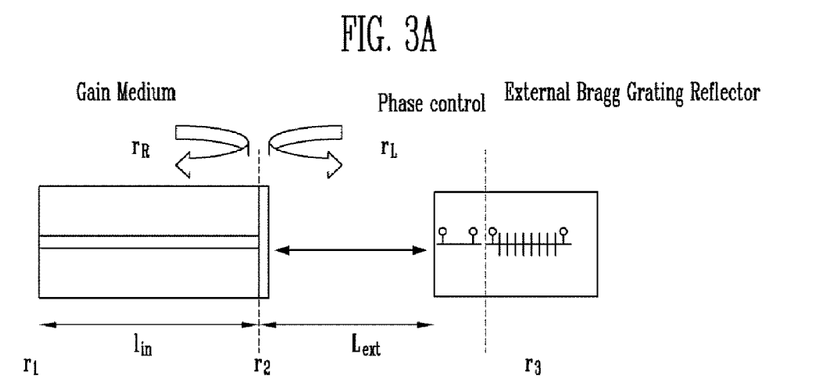
FIGS. 3A and 3B are conceptual views illustrating operations of a tunable external-cavity laser.
Figure 3B:
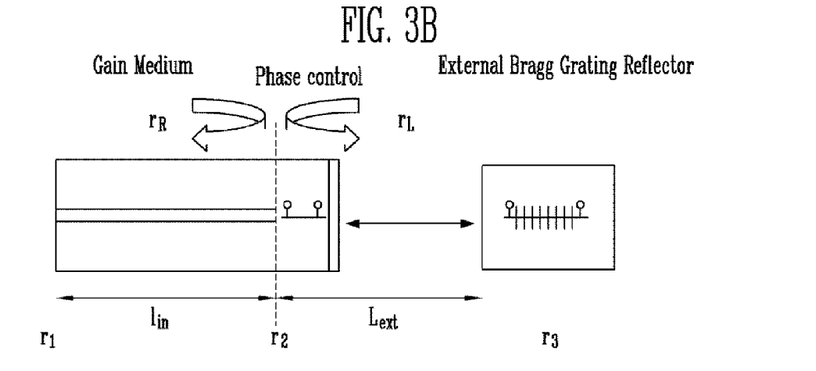

FIGS. 3A and 3B are conceptual views illustrating a structure of a tunable external-cavity laser.

Referring to FIGS. 3A and 3B, the tunable external-cavity laser may include a gain medium and external reflector.

The gain medium may be embodied to provide a gain necessary to meet the lasing condition.

The external reflector may be embodied to be tunable, for example, the wavelength may be tuned by a thermo-optic effect.

The gain medium may be made of a semiconductor material or crystal or gas molecules, and may obtain gain by pumping by an external light or injecting a current. A semiconductor laser may be integrated with a spot-size converter (SSC) to improve optical coupling with the external reflector.

The external reflector may be implemented outside the gain medium using a mirror having no wavelength selectivity or Bragg grating reflector having wavelength selectivity.

The tunable external-cavity laser may perform a wavelength tuning function based on the external reflector. For example, a tunable external-cavity laser may be implemented such that a change in wavelength of a transmitted or reflected light is induced based on injection of external current, temperature change, or angle adjustment. The tunable external-cavity laser may be implemented using a polymer material or semiconductor material and so forth. A tunable external-cavity laser may be implemented such that a refractive index may be changed by a plasma effect or thermo-optic effect or that a wavelength is tuned using changes in a diffraction angle.

In the case of implementing a tunable laser with an external-cavity structure using the thermo-optic effect, the light from a gain medium called a superluminescent diode may be coupled to an external reflector implemented by forming a Bragg grating on a waveguide with a polymer material having a large thermo-optic effect.

In a tunable external-cavity laser, a heater electrode may be implemented to adjust a Bragg wavelength by modifying the refractive index of the material. The operating wavelength varies due to temperature changes caused by the resistive heating of the heater electrode, and thus there is an advantage that the control method for changing a wavelength becomes simple, but since the material itself is very sensitive to temperature, output may easily change due to the changes in an external environment.

Figure 4A:
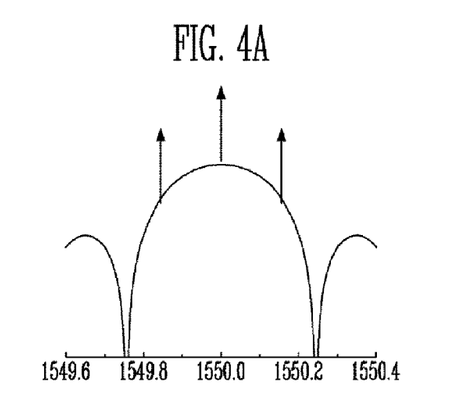
FIGS. 4A and 4B are graphs illustrating an alignment of a oscillation wavelength of a tunable external-cavity laser.
Figure 4B:
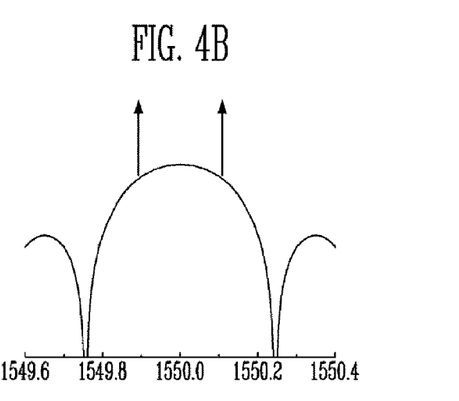

FIGS. 4A and 4B are graphs illustrating an alignment of the modes of a tunable external-cavity laser. In these graphs, the modes of a tunable external-cavity laser are shown as arrows on a spectral reflectivity curve (or if in a transmission type, transmissivity) of an external reflector.

FIGS. 4A and 4B are graphs where the modes of a tunable external-cavity laser are expressed on a reflectivity curve (or if in a transmission type, transmissivity) of a tunable external-cavity laser.

FIGS. 4A and 4B illustrate two extreme cases: the modes are arranged such that one mode is located on top of a reflection or transmission peak; and two modes are arranged symmetrically at the sides of a peak position. A general configuration of the modes is between the two extreme alignment types.

Regarding the alignment of the modes as illustrated in FIG. 4A with the effect by a nonlinear gain excluded, since the mode in the center has the highest reflectivity and thus has the lowest mirror loss, it becomes the operating mode, while the other modes become side modes. Since there is a big difference of loss between the operating mode and side modes, when a mode alignment is performed as in FIG. 4A, the spectrum having a high SMSR (side mode suppression ratio) may be obtained.

In an alignment as illustrated in FIG. 4B, since there is almost no difference of loss between the two modes, mode-hopping may easily occur even by a slight perturbation. Therefore, the operating mode becomes unstable.

Therefore, to operate the tunable external-cavity laser with stability, it is important to align the modes as in FIG. 4A, thereby stabilizing the operating mode. However, that is the case when we focus on stabilizing the operating mode. When it is important to have low chirp operation, it may be necessary to choose the longest wavelength mode as a lasing mode in FIG. 4A. In either case, to obtain the suitable configuration of the modes, it is necessary to align the modes at a reference position and then to change the alignment to a certain region from the reference position. Hereinafter, a stabilization of the output of a tunable external-cavity laser according to an embodiment of the present invention will be explained.

A tunable external-cavity laser according to an embodiment of the present invention may include a phase controller. In a tunable external-cavity laser, the operating wavelength may basically be determined by the filtered wavelength of the external reflector. Therefore, the stability of an operating mode may be determined by the relative position within a spectral reflectivity or transmissivity of the external filter.

Therefore, the phase controller may be embodied such that the wavelength of an operating mode is located in a stable position within a spectral reflectivity or transmissivity of the external filter using a phase control electrode. Positioning the wavelength of the operating mode in a desired location within a spectral reflectivity or transmissivity of the external filter may be called detuning, which means moving the wavelength of the operating mode to a longer wavelength or shorter wavelength from the maximum value of the reflectivity or transmissivity.

For example, the phase controller may be embodied to change the optical length of the entire laser cavity by minutely varying the refractive index or the distance between components, thus adjusting the position of the operating mode so that the tunable external-cavity laser operates with stability as in FIG. 4A.

Figure 5:
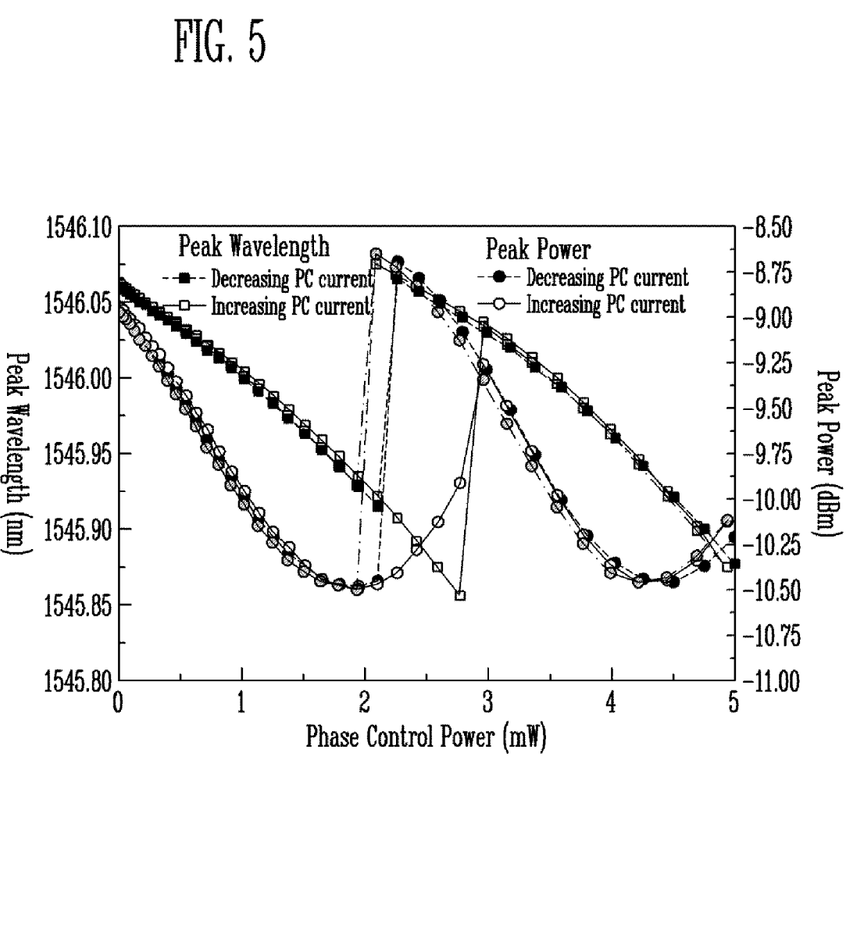
FIG. 5 is a graph illustrating changes of characteristics that occur upon operation of a phase controller in a tunable external-cavity laser according to an embodiment of the present invention.

FIG. 5 is a graph illustrating characteristics of a tunable external-cavity laser according to an embodiment of the present invention.

FIG. 5 is a graph illustrating measured results of a wavelength and power of a detuned operating mode, and the corresponding spectral reflectivity of the external reflector. Such a graph may be called a detuning curve. This graph illustrates results of a total of three measurements: two operations of decreasing the input power to a phase controller from a high value to low value, and one operation of increasing the input power to a phase controller from a low value to a high value between the two operations of decreasing the input power to a phase controller.

For example, a tunable external-cavity laser according to an embodiment of the present invention may be embodied based on a polymer material having a thermo-optic coefficient of approximately −0.3 nm/° C., and may include a phase controller.

The phase controller may, for example, be embodied by forming a heater electrode on a part of an optical waveguide having no distributed Bragg grating. When a current is injected into the phase controller to heat the material, a subtle change will occur in the refractive index due to the thermo-optic effect, and this may cause a subtle change in the entire cavity length of the laser and thus the phase of the laser is changed.

FIG. 5 illustrates measured results of a peak wavelength and a peak power.

Referring to the curve representing the measured results of a peak wavelength, it shows that as the input power to the phase controller gets lower, the operating mode moves to a longer wavelength because the material has a negative thermo-optic coefficient. For example, a mode in the center of FIG. 4A has the most highest reflectivity, and thus it is the operating mode, and in this state, when the input power to the phase controller is lowered, the mode moves to a longer wavelength region until it reaches a point where the alignment of the modes changes as in FIG. 4B, and after this point, the loss of an operating mode gets bigger than the short wavelength mode of FIG. 4B, thereby causing a mode-hopping to this mode.

On the contrary, when the input power to the phase controller gets higher, the oscillating mode may move to a shorter wavelength region. In this case, a situation opposite to the case of the input power to the phase controller getting lower occurs, and thus for the same reason, a hopping from a short wavelength mode to a longer wavelength mode occurs, which is repeated according to changes of power.

Meanwhile, a bistable region may appear in the external-cavity laser where two different modes can exist at the same input power to the phase controller, depending on the history of approaching to this power. A nonlinear gain plays an important role in causing this region to appear. By the nonlinear gain, the operating mode suppresses the lasing of the side modes, and thus even when a mode alignment as in FIG. 4B occurs, a mode-hopping does not happen and we can detune the operating mode further. Therefore, the stable operation region of the lasing mode itself increases. Another effect caused by the nonlinear gain is that a mode in a longer wavelength side is preferred over a shorter wavelength mode, and thus the overall detuning curve as a function of the reflectivity itself appears to have been moved to the longer wavelength side. Accordingly, FIG. 5 also shows that the center wavelength of the reflectivity curve is located in a shorter wavelength region of the measured detuning curve.

Referring the curve representing the measured results of a peak power, it can be seen that the optical power also changes as the operating mode is detuned. Herein, the optical power changes according to changes of reflectivity of a low reflectivity coating surface (r2 of FIGS. 3A and 3B) and changes in mirror loss. Measurements of FIG. 5 pertain to the output power being the smallest in the peak position of the reflectivity and the output power increasing as it moves to a longer wavelength or a shorter wavelength. Since the stable operation region toward a longer wavelength is larger, the biggest output power appears at the end position toward the longer wavelength. Changes of the wavelength of the operating mode explained so far are a common characteristics of an external-cavity type wavelength tunable laser, whereas the changes of an output power may show tendencies different from the aforementioned due to various factors such as internal loss of a gain medium and spectral reflectivity of the external reflector, and internal reflection inside the laser cavity etc.

However, since the tendency of the power variation is same even when the wavelength is tuned, it is possible to perform calibration after fabricating a tunable external-cavity laser so that the wavelength of the tunable external-cavity laser operating in an actual environment can be set stably.

Figure 6:
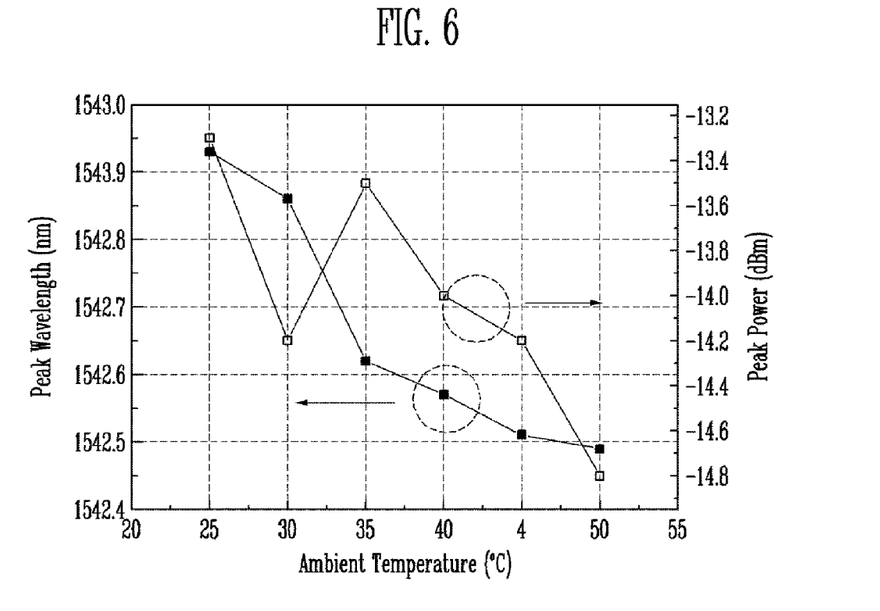
FIG. 6 is a graph illustrating changes in the wavelength and output power in the case of controlling a temperature on the part of a gain medium in a tunable external-cavity laser according to an embodiment of the present invention.

FIG. 6 is a graph illustrating changes in the wavelength and output powerpower when we control the temperature of a tunable external-cavity laser based on the temperature measured by a thermistor located on the side of a gain medium in according to an embodiment of the present invention.

Temperature was controlled by measuring the temperature of a silicon block 710 with a thermistor 713. A gain medium 711 on is placed on the silicon block 710. A module of a tunable external-cavity laser was seam sealed to exclude the effects by changes in humidity. When the ambient temperature of a module is changed from +25° C. to +50° C., the wavelength changed by more than 0.4 nm and the output power by more than 1.5 dB. Even though this temperature range is relatively narrower than a general operation range of optical module, one can see that the changes of the wavelength and power are significantly large.

Figure 7A:
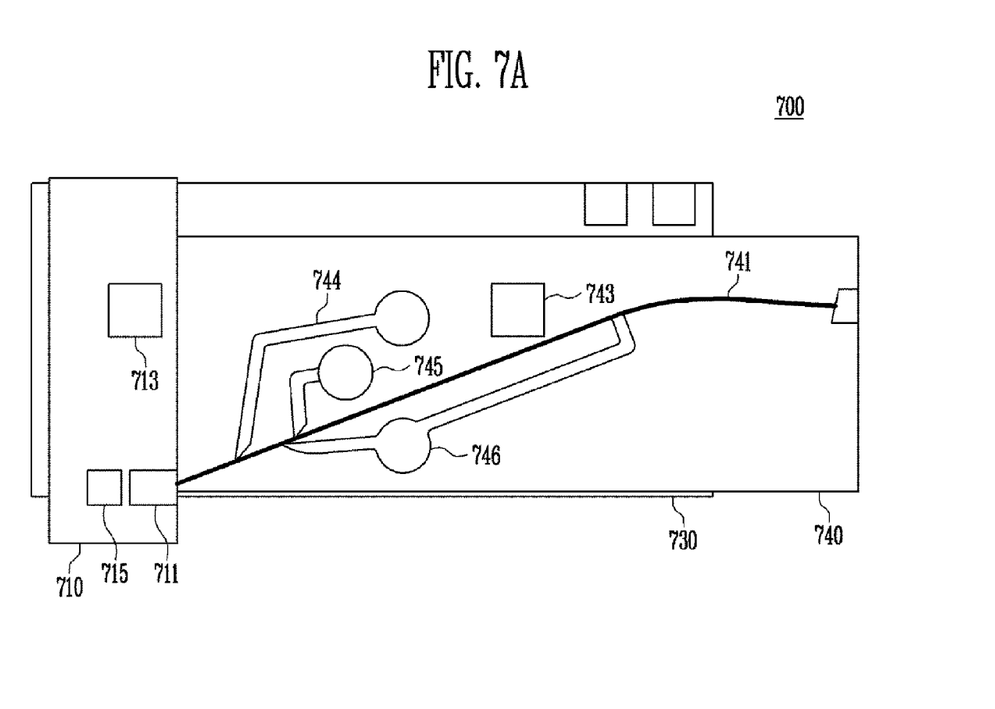
FIGS. 7A and 7B are views illustrating a configuration of a tunable external-cavity laser according to an embodiment of the present invention.
Figure 7B:
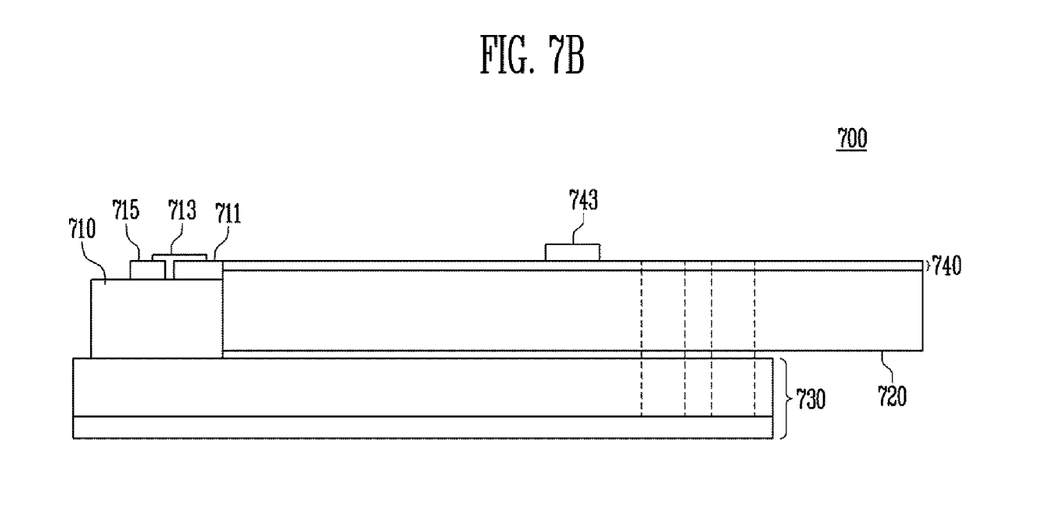

FIGS. 7A and 7B is a view illustrating a configuration of a tunable external-cavity laser 700 according to an embodiment of the present invention. FIG. 7A is a plan view of a tunable external-cavity laser 700 according to an embodiment of the present invention, and FIG. 7B is a side view of a tunable external-cavity laser 700 according to an embodiment of the present invention.

Referring to FIGS. 7A and 7B, a tunable external-cavity laser 700 according to an embodiment of the present invention includes a silicon block 710, silicon substrate 720, and thermoelectric cooler 730. On the silicon block 710, a gain medium 711 is mounted. On the silicon substrate 720, a polymer Bragg grating reflector (PBR) 740 may be formed. The polymer Bragg grating reflector 740 exists outside the silicon block where the gain medium 711 is mounted, and may play the role of an external reflector that directly couples with the gain medium.

Furthermore, on the silicon block 710 mounting the gain medium 711, a second thermistor 713 is provided, and on the PBR 740 of the silicon substrate 720, a first thermistor 743 is provided. As illustrated in FIG. 7A, on the silicon substrate 720, a PBR 740 is formed, and a first electrode 744 for adjusting a phase, a second electrode 745 for adjusting the wavelength of the PBR 740, and a third electrode 746 that may be used as a common ground of the two electrodes are formed. The heater electrode for adjusting the wavelength of the PBR 740 consists of a second electrode 745 and third electrode 746. The second electrode 745 and third electrode 746 are formed near where the Bragg grating of the PBR 740 is formed, and are configured to move a reflected wavelength by applying heat. Furthermore, the phase control electrode for adjusting a phase of the PBR 740 consists of a first electrode 744 and third electrode 746. The first electrode 744 and third electrode 746 are formed on a part of a waveguide where a Bragg grating is not formed, and causes changes in refractive indexes by generating heat, thereby causing changes in wavelength, that is phase changes in the oscillation mode. The third electrode 746 is configured to perform the role of a common ground for the heater and phase control electrode as shown in the drawing. It may be formed as two separate electrodes.

In realizing the tunable external-cavity laser 700, the gain medium 711 and the PBR 740 which is a tunable filter may be butt-coupled. The main purpose of this butt-coupling is to reduce the entire cavity length of the laser thereby enabling high speed operation, and there is an additional effect of reducing the number of optical components, reducing the costs as well. The light from the gain medium 711 is coupled to the PBR 740 by an active or passive alignment method and this coupling may be maintained by fixing the silicon block 710 where the gain medium 711 to the silicon substrate 720 where the PBR 740 is formed by using a UV curable adhesive.

Furthermore, it is possible to further provide a power monitoring photodiode 715 in a rear side of the gain medium 711 so that the tunable external-cavity laser 700 may operate in a certain power value.

In order to maintain the temperature of the gain medium that changes according to an applied current, a typical laser has the thermistor one a side of the gain medium, and the thermoelectric cooler is controlled based on the temperature read from the thermistor. In the case of configuring a tunable external-cavity laser as aforementioned, significant changes occur in terms of characteristics as illustrated in FIG. 6.

A tunable external-cavity laser 700 according to an embodiment of the present invention includes a first thermistor 743 on the PBR 740 besides the second thermistor 713 provided on the gain medium 711. Therefore, it is possible to minimize changes in the characteristics of the tunable external-cavity laser 700 using a thermistor for temperature control.

Figure 8:
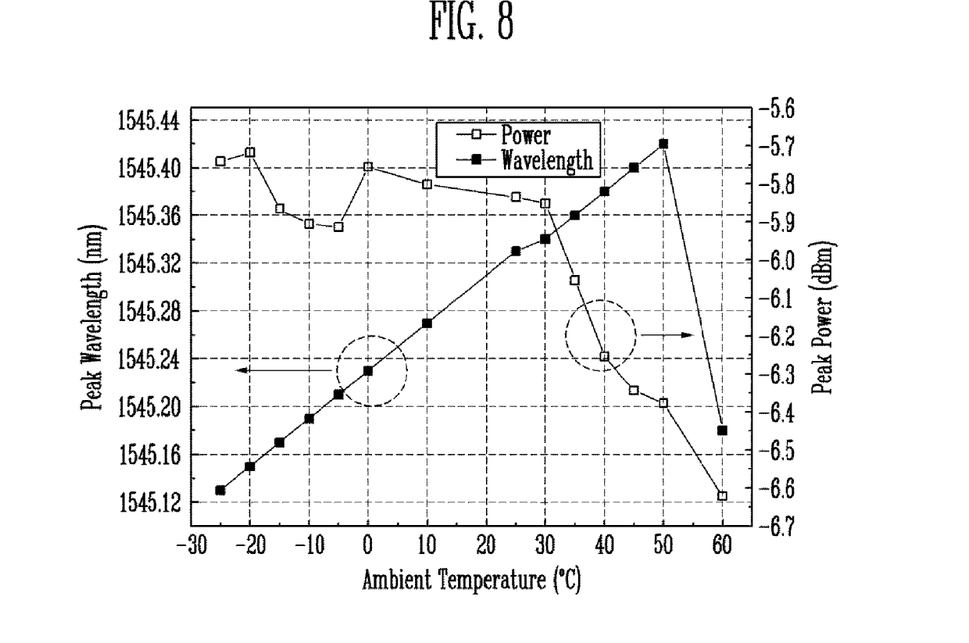
FIG. 8 is a graph illustrating changes in the wavelength and output power in the case of controlling a temperature of an external-cavity in a tunable external-cavity laser according to an embodiment of the present invention.
Figure 9A:
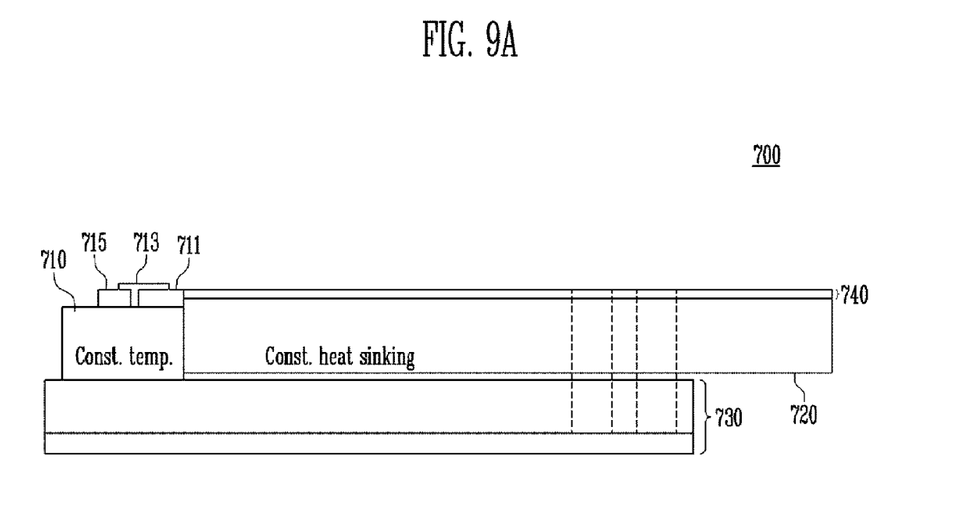
FIGS. 9A and 9B are views for explaining a heat transfer path in a tunable external-cavity laser according to an embodiment of the present invention.
Figure 9B:
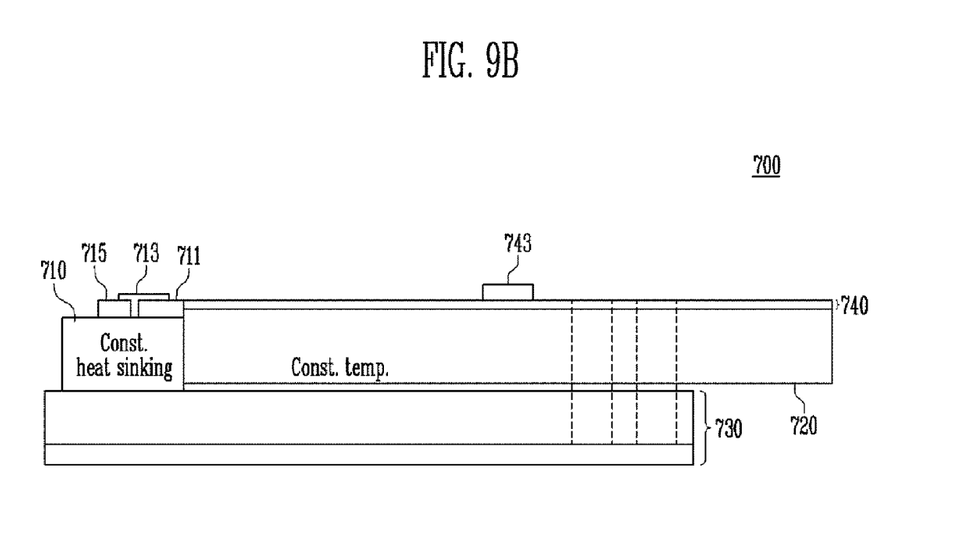

FIG. 8 is a graph illustrating changes in the wavelength and output power in the case of controlling a temperature of a tunable external-cavity laser according to an embodiment of the present invention. FIG. 8 illustrates measured results of changes in wavelength and output power of a light source according to changes of ambient temperature. Referring to FIG. 8 and FIG. 6, one can see that FIG. 8 shows a smaller wavelength change (0.29 nm) and power change (0.9 dB) even in a larger temperature range than FIG. 6. It shows that a mode-hopping occurs in 60° C. This is due to the intrinsic characteristics of a butt coupled external-cavity type wavelength tunable laser. FIGS. 9A and 9B are views for explaining heat transfer paths in tunable external-cavity lasers according to an embodiment of the present invention.

FIG. 9A illustrates a configuration for temperature control in a typical tunable external-cavity laser. In the case of a typical tunable external-cavity laser, temperature is controlled through the second thermistor 713 based on the temperature of the gain medium 711, and thus the temperature of the gain medium may be maintained constant when the ambient temperature changes. However, that is not the case for the temperature of the external tunable filter 740 in the case of a typical tunable external-cavity laser. That is, when the temperature is controlled by the TEC to maintain the temperature of the gain medium constant, the same heat per unit area as a portion of the gain medium is drawn from a portion of the tunable filter, wherein when the ambient temperature changes, the amount of heat to be transferred to maintain a certain temperature of the gain medium will change, thereby changing the temperature of the PBR 740.

It may be possible to optimize the area ratio of the silicon block and substrate to be placed on the TEC, thereby having the same temperature change occur on both sides, but this is not easy in terms of manufacturing. Therefore, the operation wavelength will move according to temperature changes of the external tunable filer, and the output power will also change due to the accompanying detuning as illustrated in FIG. 5. Accordingly, characteristics will change easily even by a small change of a temperature.

FIG. 9B illustrates of configuration for temperature control in a tunable external-cavity laser according to an embodiment of the present invention. As illustrated in FIG. 9B, when an additional thermistor 743 is mounted on the PBR 740 and the temperature is controlled based on the thermistor 743, the operation temperature of the tunable filter will be fixed even when the ambient temperature changes, thereby maintaining a certain operation wavelength of the external-cavity laser.

On the other hand, the gain medium portion may be changed by the ambient temperature changes by the amount of heat transfer per unit area controlled through the first thermistor. In the case of the output power of the tunable external-cavity laser, changes of characteristics due to the temperature changes of the gain medium portion caused by the control method of the present invention is not so significant (about 5° C. in FIG. 10), and thus the changes of characteristics will be small as illustrated in FIG. 8.

Meanwhile, even by controlling the temperature as such, it is impossible to separate the changes of characteristics of a module from changes of ambient temperature even when the temperature is controlled as aforementioned. Even when the temperature is controlled against the external tunable filter as in the results of changes in the peak wavelength in FIG. 8, the wavelength and power change, which may be explained with reference to FIG. 5. Even when temperature control is performed against the external tunable filter, a small phase change may occur according to temperature changes in a free space in a package surrounding the laser. That is, a detuning occurs due to the changes in length or refractive index of the gain medium or the external tunable filter as the temperature changes in a free space acts similarly as temperature changes in the phase controller. As in the peak power changes of FIG. 5, it is possible to cause a change of more than 1 dB and a change of wavelength by a mode distance. Referring to FIG. 5, the wavelength change is larger than 0.2 nm, thereby going beyond the allowance range of the ITU (International Telecommunication Union) 100 GHz or 50 GHz grid. In order to correct this, a tunable external-cavity laser according to an embodiment of the present invention uses a side thermistor of the gain medium.

Figure 10:
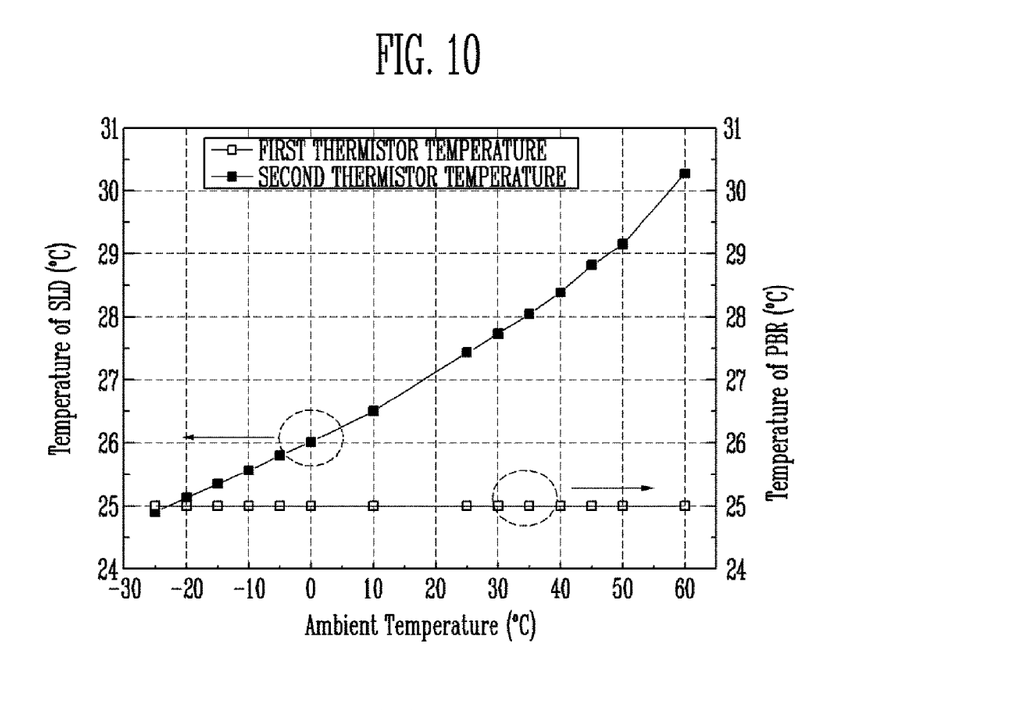
FIG. 10 is a view illustrating changes in a temperature on the part of a gain medium in the case of changing an ambient temperature of a tunable external-cavity laser according to an embodiment of the present invention.

FIG. 10 is a graph illustrating the measured results of temperature changes in the case of changing the ambient temperature of the external-cavity type light source according to an embodiment of the present invention.

FIG. 10 is a measured result of temperature changes on the side of the gain medium when the laser temperature is fixed by the first thermistor 743 to 25° C. In the case of the first thermistor 743 that plays the role of a thermistor of control use, it controls the temperature of the PBR 740 regardless of the temperature of the ambient temperature, and thus it can be seen that a certain temperature is being maintained, but in the case of the second thermistor 713 that is the side thermistor of the gain medium, it can be seen that the temperature changes according to the change of the ambient temperature. This induces a detuning to occur when the ambient temperature changes.

Figure 11:
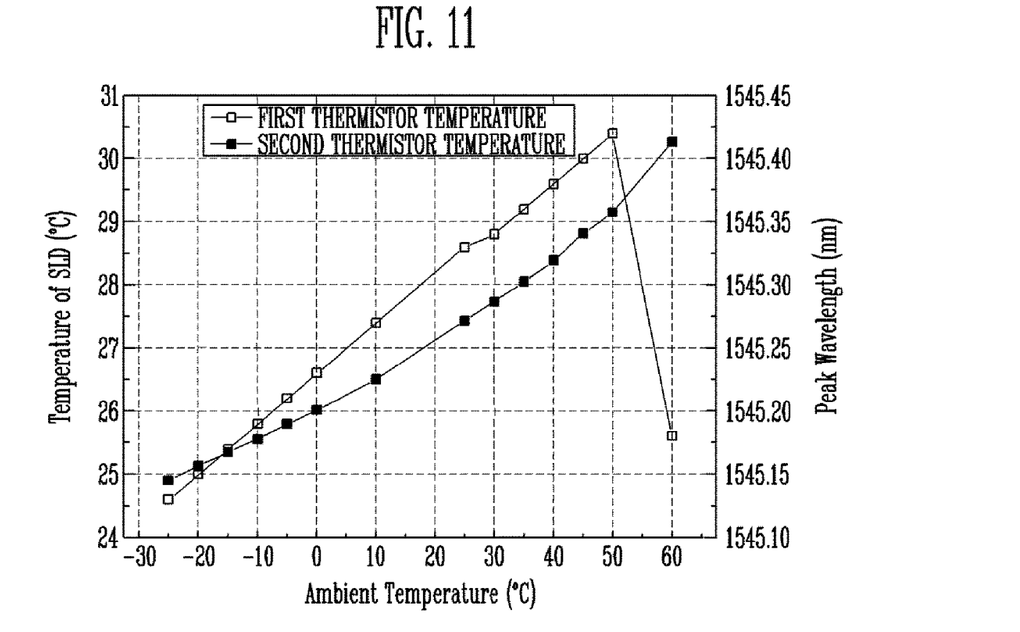
FIG. 11 is a graph illustrating changes in a temperature on the part of a gain medium and output wavelength according to changes in an ambient temperature in an external-cavity type wavelength tunable laser according to an embodiment of the present invention.
Figure 12:
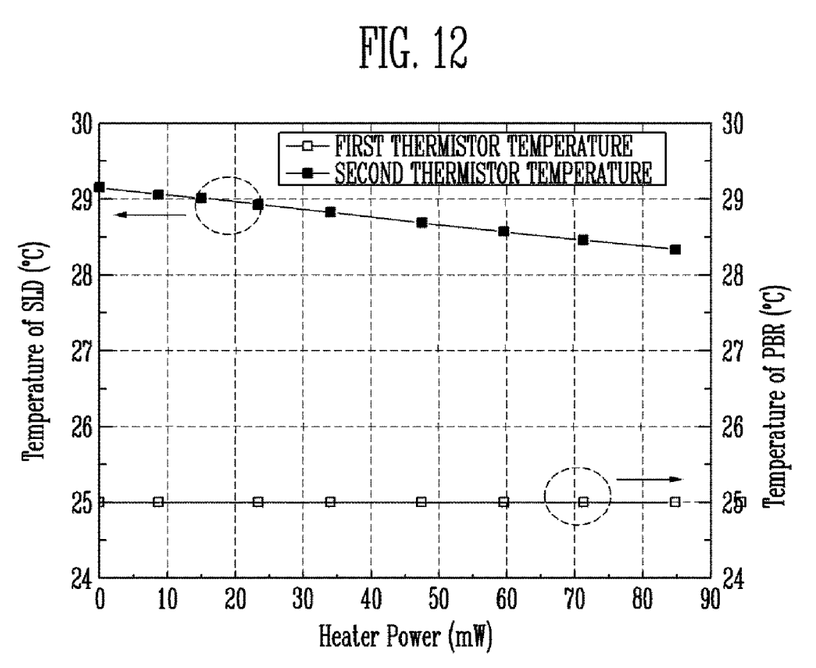
FIG. 12 is a graph of measurements of a temperature of a gain medium in the case of changing a heater power in a tunable external-cavity laser according to an embodiment of the present invention.

FIG. 11 is a graph illustrating changes in a temperature on the part of a gain medium and output wavelength according to changes in an ambient temperature in an external-cavity type wavelength tunable laser according to an embodiment of the present invention.

Referring to FIG. 11, the changes of temperature of the second thermistor 713 which is the side thermistor of the gain medium and the peak wavelength changes are almost linear, and a mode-hopping occurs at the last temperature of 60° C. Since the two curves representing the temperature change of the second thermistor 713 and the wavelength change show similar variation, one can find a linear or more higher polynomial functional form between them, and this function can be used to measure the ambient temperature changes using the second thermistor 713, thereby controlling the detuning by the phase change control.

In the drawings and specification, there have been disclosed typical embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An external-cavity type wavelength tunable laser comprising:
   a gain medium configured to generate an optical signal and amplify the generated optical signal based on a bias current applied;
   an external reflector configured to be coupled optically with the gain medium;
   a second thermistor provided on the side of the gain medium and configured to measure a temperature of the gain medium;
   a first thermistor provided on the external reflector and configured to measure a temperature of the external reflector; and
   a thermoelectric cooler configured to configured to transfer generated heat based on the temperatures measured by the first thermistor,
   wherein the external reflector comprises a heater electrode for wavelength adjustment and a phase control electrode for phase control, and
   the external reflector controls an output wavelength based on a relationship between the temperature measured by the second thermistor and an electrical power input to the heater electrode.

2. The external-cavity type wavelength tunable laser according to claim 1,
   wherein the gain medium and the external reflector are butt-coupled.

3. The external-cavity type wavelength tunable laser according to claim 1,
   wherein the external reflector is a polymer-based Bragg grating.

4. An external-cavity type wavelength tunable laser comprising:
   a gain medium configured to generate an optical signal and amplify the generated optical signal based on a bias current applied;
   an external reflector configured to be coupled optically with the gain medium;
   a second thermistor provided on the side of the gain medium and configured to measure a temperature of the gain medium;
   a first thermistor provided on the external reflector and configured to measure a temperature of the external reflector; and
   a thermoelectric cooler configured to configured to transfer generated heat based on the temperatures measured by the first thermistor,
   wherein the external reflector comprises a heater electrode for wavelength adjustment and a phase control electrode for phase control, and
   the external reflector compensates a phase change through the phase control electrode based on the temperature measured by the second thermistor and the temperature measured by the first thermistor.

5. An external-cavity type wavelength tunable laser comprising:
   a gain medium configured to generate an optical signal and amplify the generated optical signal based on a bias current applied;

an external reflector configured to be coupled optically with the gain medium;
a second thermistor provided on the side of the gain medium and configured to measure a temperature of the gain medium;
a first thermistor provided on the external reflector and configured to measure a temperature of the external reflector; and
a thermoelectric cooler configured to configured to transfer generated heat based on the temperatures measured by the first thermistor,
wherein the gain medium and the second thermistor are mounted on a silicon block, and the external reflector and the first thermistor are formed on a silicon substrate.

6. The external-cavity type wavelength tunable laser according to claim 5,
wherein the light from the gain medium is coupled to the external reflector by an active or passive alignment method.

7. The external-cavity type wavelength tunable laser according to claim 6,
wherein the silicon block and the silicon substrate are fixed to each other by a UV curable adhesive.

* * * * *